July 28, 1970 W. E. TAYLOR ET AL 3,522,118
GAS PHASE ETCHING
Filed Aug. 17, 1965
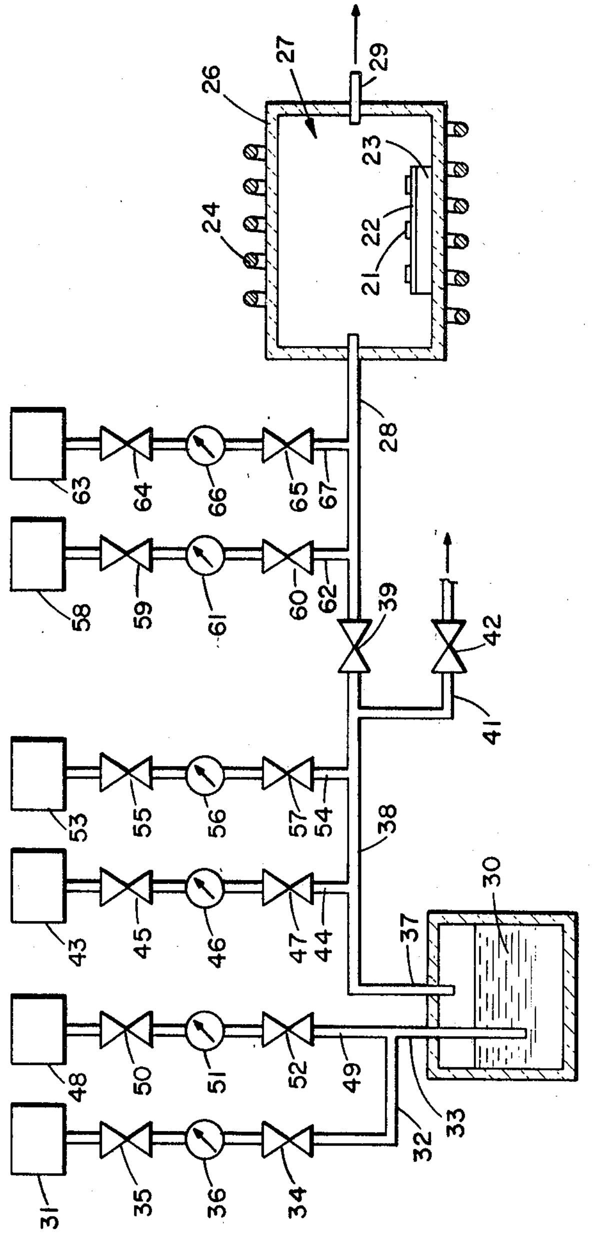
INVENTOR.
William E. Taylor
Howard N. Klink
BY Mueller, Aichele & Rauner
ATT'YS.

United States Patent Office 3,522,118

Patented July 28, 1970

3,522,118

GAS PHASE ETCHING

William E. Taylor and Howard N. Klink, Phoenix, Ariz., assignors to Motorola, Inc., Franklin Park, Ill., a corporation of Illinois Filed Aug. 17, 1965, Ser. No. 480,452
Int. Cl. H01l 7/36, 7/44
U.S. Cl. 156—17 5 Claims

ABSTRACT OF THE DISCLOSURE

Monocrystalline semiconductor wafers are prepared for epitaxial growth by gas-phase etching with a semiconductor halide contained in an inert diluent. A helium diluent, for example, permits the etching to proceed at a satisfactory rate with a semiconductor halide concentration of only 1% or less.

This invention relates generally to the etching of semiconductor material, and more particularly, to an improved method of gas phase etching semiconductor material in the production of various semiconductor devices.

In the manufacture of semiconductor devices, it is important that the material being processed have smooth, flat surfaces free from contamination. Further, it is important that the processing and fabricating operations performed on the material maintain the surface in this condition.

The mechanical operations of sawing a large crystal into thin wafers and lapping and polishing the wafers are responsible for a certain amount of surface and subsurface damage and contamination to the wafers, and etching operations are employed to remove the damaged material. Unfortunately, conventional etching methods tend to initially accentuate any scratches or deeply damaged areas and as a result considerable additional material generally must be removed to provide a smooth, flat surface.

Conventional liquid phase etching using chemical or electrochemical methods is not completely successful because the etching residues frequently are difficult to remove and if allowed to remain have marked degrading effects on the devices fabricated from such material.

Furthermore, when the surface is not clean and smooth, dopants which may be diffused into the surface in subsequent processing will not diffuse with sufficient uniformity to achieve the desired electrical characteristics.

Also, thin films subsequently deposited or otherwise formed on the etched surfaces of the wafers will lack uniformity if the surfaces are not clean and smooth. For example, the deposition of oxide layers or epitaxially grown layers are adversely affected.

Even when the semiconductor material has been carefully cleaned initially, contamination still may become a problem. The simple act of handling a wafer of semiconductor material during processing, regardless of how carefully, can cause dust to settle on the surface. Contamination can even occur within the enclosed reaction chamber used to grow epitaxial films. For example, material which has been deposited on the inner surfaces of the reaction chamber in previous epitaxial growth operations may flake off and settle on the wafers.

While gas phase etching has been employed to provide smooth surfaces on semiconductor wafers, the gas etching processes which were heretofore known have not been completely free of problems. One of the problems is that previous gas etching methods have employed materials which are highly corrosive. The resulting corrosion products not only contaminate the surface of the wafers, but also the corrosive action on the etching equipment itself, necessitates frequent replacement. A further problem is the difficulty of obtaining etching materials of very high purity to avoid further contamination of the wafers from this source.

An object of the present invention is to provide an improved method for gas phase etching semiconductor material.

A further object of the invention is an improved etching method which may be employed sequentially with an epitaxial growth step.

Another object of the invention is to provide a method for etching semiconductor material which does not employ corrosive materials.

An additional object is to provide a method for etching semiconductor material which greatly reduces contamination of the material.

A further object of the invention is to provide a method which produces etched wafers of improved smoothness and purity.

A feature of the invention is a method of etching semiconductor materials employing a gaseous mixture including a halide of the semiconductor material being etched.

Another feature of the invention is an etching method employing a gaseous mixture comprising a high purity halide of the semiconductor material being etched and a high purity gaseous diluent which is inert to the semiconductor material at the etching temperature.

The invention is illustrated by the accompanying drawing, the single figure of which is a schematic diagram showing a system for etching semiconductor material in accordance with the method of the invention.

The present invention is embodied in a method for etching semiconductor material to provide a smooth, flat surface, which method comprises subjecting the material to a gaseous mixture comprising a halide of the semiconductor material and a diluent which is inert to the semiconductor material, while maintaining the temperature of the material above about 700° C. The upper limit of the reaction temperature is the melting point of the particular material being etched.

The semiconductor material which is etched in accordance with the method of the present invention is advantageously a single crystal element of silicon or germanium, although various semiconductor compounds also may be employed. The crystal element is advantageously a wafer which is typically obtained from a larger crystal grown by known crystal pulling or zone melting processes. The larger crystal is sliced into wafers, and the wafers lapped, polished, and otherwise processed to make their major faces substantially parallel to each other. The cross-sectional dimension of the wafers may be of any value and the thickness of the wafers can be within a practical range, e.g., about 4 to 40 mils.

The semiconductor compound used to form the vapors employed in the method of the invention is a halide of the semiconductor material being etched. In the case of a semiconductor material which is a combination of elements, e.g., gallium arsenide, the semiconductor compound may be a halide of one of the elements. Preferably, the compound is fully halogenated, such as silicon tetrachloride, germanium tetrachloride, etc., although compounds containing a substantial proportion of the halogen, e.g., trichlorosilane, also may be employed.

The gaseous diluent is inert to the semiconductor material at the etching temperatures, e.g., above about 700° C. The inert gas preferably is helium but also may be argon, neon, xenon, krypton, nitrogen, etc.

In accordance with one embodiment of the method of the invention, wafers are placed in a reactor furnace. The furance may be a quartz tube which is heated by induction heating coils while the wafers are positioned on a quartz slab inside the furnace. Advantageously, the temperature when germanium is being etched is maintained between about 700° and 930° C. and preferably between 725° and 800° C. In the etching of silicon, the temperature is advantageously between about 800° and 1400° C. and preferably between about 1000° and 1300° C.

The gaseous etching mixture advantageously comprises between about 0.01% and 25% by volume of the semiconductor halide and preferably, between about 0.1% and 10%.

In a preferred embodiment of the method of the invention, a stream of the inert gas is passed over the wafers after the wafers have been placed in the furnace prior to the actual etching operation to flush the furnace. Thereafter, a gaseous mixture of the semiconductor halide and the inert gas is passed over the heated wafers to etch the surfaces thereof.

A suitable system for conducting the method of the present invention is shown in the drawing. In the embodiment is shown a single crystal semiconductor material in the form of wafers 21 which are placed on a slab 22 of quartz carried on a susceptor 23 of graphite or molybdenum. The upper face of each wafer is advantageously, but not necessarily, parallel to a selected crystallographic plane of the wafers, such as that identified by Miller Indices (111). The susceptor 23 is heated by an induction heating coil 24 which is located on the outside of the quartz tube 26 which forms the reaction chamber 27.

The gaseous etching mixture is introduced into the reaction chamber through an inlet pipe 28. The byproducts of the reaction which takes place in the chamber 27 leave the chamber through outlet 29. The temperature within the reaction chamber may be measured using an optical pyrometer which is not shown in the drawing.

The vapors may be formed from a liquid semiconductor halide, for example, silicon tetrachloride, contained in a saturator 30. An inert diluent gas such as helium, from a source 31 is passed through the liquid by means of suitable piping lines 32 and 33. The flow rate of the incoming gas is controlled by valve 35 and is measured by a meter 36. A shut-off valve 34 is also provided in line 32. An outlet line 37 from the saturator 30 leads to a main line 38 which connects to the inlet 28 of the reaction chamber through a valve 39. In starting the system, valve 39 is closed and the gas mixture from lines 37 and 38 is vented through a piping line 41 containing a valve 42 while the gas mixture is being stabilized.

The proportion of semiconductor halide vapors in the inert gas may be controlled accurately by diluting the outgoing gas from the saturator 30 with additional quantities of inert gas supplied from another source 43, through main piping line 44 which connects into line 38. Line 44 has valves 45 and 47 and a meter 46 for controlling and measuring the flow rate of the inert gas which comprises the major portion of the gaseous mixture.

The vapor pressure over the liquid in the saturator 30 is kept constant by maintaining the saturator 30 at a constant temperature such as with cooling coils (not shown). The resulting gas mixture is passed through lines 38 and 28 into the reaction chamber 27 and across the surfaces of wafers 21, etching the surfaces. The byproducts are removed through outlet line 29.

After the desired degree of etching has been achieved, valves 34 and 47 are closed and hydrogen from a source 48 is passed through the semiconductor halide liquid in saturator 30 by means of a piping line 49. Line 49 has valves 50 and 52 and a meter 51. The hydrogen gas passing through saturator 30 mixes with the vapors of the semiconductor halide therein. The resulting vapors pass out of the saturator through lines 37 and 38. Additional hydrogen from a source 53 may be added to the gas stream in line 38 through a line 54. Line 54 has valves 55 and 57 and a meter 56. The resulting gas mixture in line 38 consisting of a small proportion of the semiconductor halide in hydrogen gas is passed into chamber 27 and over the surfaces of wafers 21 growing an epitaxial layer on the surfaces of the single crystal wafers.

Before the start of the etching step, it is advantageous to flush the air and other contaminants from the reaction chamber 27, by introducing an inert gas from a source 58 through a line 62, main line 38 and into chamber 27. Line 62 has valves 59 and 60 and a meter 61. Also, in switching from the etching to the epitaxial growth step, it is desirable to flush the reaction chamber 27 with hydrogen from a source 63 through line 67. Line 67 has valves 64 and 65 and a meter 66. Doped epitaxial films may be obtained by introducing minor amounts of doping impurities into the main gas stream from other sources (not shown).

The following examples illustrate specific embodiments of the invention, although it is not intended that the examples in any way restrict the scope of the invention.

EXAMPLE I

The above-described apparatus was employed to etch a single crystal silicon wafer by the following procedure.

A number of silicon wafers of a size of about 0.7 inch in diameter and about 7.5 mils thick were placed on a quartz covered graphite boat and the boat inserted into a furnace. The furnace was heated to a temperature of about 1100° C. and flushed with helium. A stream of helium gas having a flow rate of about 30 liters per minute was mixed with a vapor mixture of silicon tetrachloride and helium having a flow rate of about 1 liter per minute. The helium was of very high purity and contained less than about 10 parts per million of total impurities. Helium gas was passed through a vessel containing liquid silicon tetrachloride at about 25° C. to form the vapor. The purity of the silicon tetrachloride was such that it was capable of forming silicon having a resistivity of more than about 30 ohm-centimeters.

The gas mixture containing about 1% silicon tetrachloride was passed through the epitaxial furnace for about 10 minutes after which the furnace was cooled and the boat containing the wafers removed from the furnace. The wafers were examined visually and were found to have clean, smooth surfaces substantially free from inclusions or contaminants. The wafers were further examined under a microscope and the visual results were confirmed. The surfaces were clean and smooth.

The boat containing the previously etched wafers was replaced in the epitaxial furnace and the furnace flushed with hydrogen gas while the furnace was being heated to a temperature of about 1100° C. A stream of hydrogen gas at a flow rate of about 30 liters per minute was mixed with a mixture of silicon tetrachloride and hydrogen having a flow rate of about 500 cuubic centimeters per minute. The hydrogen was very high purity and contained less than about 10 parts per million of impurities. The silicon tetrachloride was from the same source as that employed in the etching step and was maintained at a temperature of about 25° C. while the hydrogen gas was passed therethrough. The tetrachloride constituted about 0.5% by volume of the gas mixture which was passed through the epitaxial furnace for about 20 minutes. The furnace then was cooled and the boat containing the wafers removed from the furnace.

The wafers were examined visually and the silicon layer grown on the silicon wafers was found to be smooth and uniform and substantially free from inclusions. The wafers were further examined under a microscope, and the visual results were confirmed. The epitaxial layer on each wafer was smooth and uniform and free of inclusions substantially over the entire surface.

Semiconductor devices such as transistors, diodes, etc., made by the above procedure exhibited electrical properties equal to or better than devices made by other silicon etching and growth processes.

EXAMPLE II

The procedure of this example was the same as that of Example I, except that the flow rate of the silicon tetrachloride-helium gas mixture mixed with the main helium gas stream was doubled. The wafers were placed in a furnace and then etched for a relatively short period of about 10 minutes. After the etching treatment the furnace was cooled and the wafers removed for examination. The wafers had clean, smooth surfaces. The wafers were replaced in the furnace and an epitaxial layer grown on the etched surfaces according to the procedure of Example I. The epitaxial layer on the wafers was examined and found to be smooth, uniform and substantially free of inclusions. The wafers were used for the formation of various semiconductor devices which exhibited electrical properties of equal or better quality than devices made by other silicon etching and growth processes.

EXAMPLE III

The procedure of this example was the same as that of Example I except that the wafers were single crystal germanium and germanium tetrachloride was employed in place of silicon tetrachloride. The temperature of the etching operation was about 750° C. The flow rate of the germanium tetrachloride-helium gas mixture was about 800 cubic centimeters per minute, and this mixture was incorporated into a main stream of helium flowing at a rate of about 25 liters per minute to form a mixture containing about 0.4% by volume of the tetrachloride. The etching treatment was performed for about 5 minutes. The etched wafers were found to have clean, smooth surfaces similar to the wafers of Examples I and II.

An epitaxial layer was grown over the etched surfaces following the general procedure of Example I but employing germanium tetrachloride instead of silicon tetrachloride. Devices made from the resulting wafers exhibited the same high quality as the devices of the previous examples.

EXAMPLE IV

The procedure of this example was the same as that of Example I, except that the helium was replaced by argon. The same superior etching results were achieved as those achieved in Example I.

EXAMPLE V

The procedure of this example was the same as that of Example II, except that the helium was replaced with nitrogen gas having a purity of about 99.99+%. Devices made from the wafers after they had been etched and material grown, were found to exhibit high quality similar to the devices of the previous examples.

The above description, drawing and examples show that the present invention provides a novel method for etching semiconductor material. The etching method of the invention provides improved smoothness and uniformity and does not employ corrosive materials. Furthermore, the method is simple and relatively low cost on a production basis and produces surfaces with greatly reduced contamination.

From the above description, examples and drawing, it is apparent that various modifications in the detailed procedures described may be made within the scope of the invention. Therefore, the invention is not intended to be limited to the specific procedures except as may be required by the following claims.

What is claimed is:

1. A method of etching a silicon substrate which comprises subjecting the silicon substrate to a gaseous mixture consisting essentially of a fully halogenated silicon compound and an inert diluent while maintaining the temperature of the substrate above 800° C., said diluent being inert to the silicon at the etching temperature.

2. The method in accordance with claim 1 wherein said gaseous mixture includes between 0.01% and 25% by volume of the fully halogenated silicon compound.

3. A method of etching a silicon substrate which comprises subjecting the silicon substrate to a gaseous mixture consisting essentially of silicon tetrachloride and an inert diluent while maintaining the temperature of the silicon substrate between about 1000° and 1300° C., said diluent being inert to the silicon at the etching temperature, and said gaseous mixture comprising between about 0.01% and 25% by volume of silicon tetrachloride.

4. The method in accordance with claim 3 wherein said gaseous mixture comprises between about 0.01% and 10% by volume of silicon tetrachloride.

5. The method in accordance with claim 3 further including subjecting the etched silicon substrate to a gaseous mixture comprising a semiconductor halide and hydrogen gas to grow epitaxial semiconductor material on the etched surface.

References Cited

UNITED STATES PATENTS

| | | | |
|---|---|---|---|
| 3,171,755 | 3/1965 | Reuschel et al. | 117—200 |
| 3,243,323 | 3/1966 | Corrigan et al. | 148—175 |
| 3,370,995 | 2/1968 | Lowery et al. | 148—175 |
| 3,366,520 | 1/1968 | Berkenblit et al. | 156—17 |
| 3,392,069 | 7/1968 | Merkel et al. | 156—17 |

OTHER REFERENCES

Shinya Iida et al.: Japan, J. Appl. Physics, March 1964, 61–62, Vapor Etching of Ge by $GeI_4$.

JACOB H. STEINBERG, Primary Examiner

U.S. Cl. X.R.

148—175